United States Patent

[11] 3,611,067

[72] Inventors David W. Oberlin
San Jose;
Theodore I. Kamins, Mountain View, both of Calif.

[21] Appl. No. 29,817
[22] Filed Apr. 20, 1970
[45] Patented Oct. 5, 1971
[73] Assignee Fairchild Camera and Instrument Corporation
Mountain View, Calif.

[54] COMPLEMENTARY NPN/PNP STRUCTURE FOR MONOLITHIC INTEGRATED CIRCUITS
6 Claims, 2 Drawing Figs.

[52] U.S. Cl. .................................................... 317/235 R, 317/234 R, 317/235 E, 317/235 U, 317/235 AN, 317/235 AM, 317/235 AT, 148/175
[51] Int. Cl. .................................................... H01l 19/00
[50] Field of Search .......................................... 317/235 (22), 235 (31), 235 (22.11), 235 (41.1), 235 (48.2)

[56] References Cited

UNITED STATES PATENTS

| | | | |
|---|---|---|---|
| 3,502,951 | 3/1970 | Hunts ........................... | 317/235 |
| 3,473,090 | 10/1969 | Bohannon, Jr. .............. | 317/235 |
| 3,524,113 | 8/1970 | Agusta et al. ................. | 317/235 |

FOREIGN PATENTS

| | | | |
|---|---|---|---|
| 805,341 | 1/1969 | Canada ........................ | 317/235 |

*Primary Examiner*—John W. Huckert
*Assistant Examiner*—B. Estrin
*Attorneys*—Roger S. Borovoy, Alan H. MacPherson and Charles L. Botsford

ABSTRACT: NPN and PNP transistors are fabricated in the same monolithic semiconductor substrate without compromising the electrical characteristics of the NPN or the frequency response of the PNP. The NPN has a double-diffused structure, while the PNP has a diffused emitter, an epitaxial base, and a Schottky-barrier collector-base junction.

INVENTORS
DAVID W. OBERLIN
THEODORE I. KAMINS
BY Charles L. Botsford
ATTORNEY

COMPLEMENTARY NPN/PNP STRUCTURE FOR MONOLITHIC INTEGRATED CIRCUITS

BACKGROUND OF THE INVENTION

1. Field of the Invention

This invention relates to monolithic integrated circuits, and in particular, to a monolithic integrated circuit having a plurality of semiconductor areas electrically isolated from each other. Located in at least one isolation area is an NPN transistor having a frequency response on the order of 300 to 50 MegaHertz, and located in at least one other isolation area is a PNP transistor having a frequency response on the order of 50 MegaHertz.

2. Description of the Prior Art

For high-frequency response, it is generally preferable to use transistors having a vertical structure, because the distance between junctions is usually on the order of microns. Typically, vertical structures are made by a double-diffusion process, where the substrate is the collector, the base region is located in the collector, and the emitter is located in the base.

In integrated circuit applications where a plurality of devices are fabricated on the same monolithic semiconductor substrate, however, it has been difficult to make both a PNP transistor and an NPN transistor so that both have a vertical structure and therefore a relatively high-frequency response. When the NPN and PNP transistors are fabricated on the same monolithic substrate, a compromise is usually made either in the electrical characteristics of the NPN transistor, or in the frequency response of the PNP transistor, or both. Because of the multitude of impurity profiles needed if both the NPN and PNP transistors have a double-diffused structure, of necessity one transistor must be fabricated before the other. For example, if the NPN transistor is fabricated first, subsequent high-temperature diffusion steps are necessary to fabricate the PNP transistor, which will detrimentally affect the electrical characteristics of the NPN transistor. Moreover, the multitude of impurity profiles needed means that the processing control problems are very complex, and thus are economically undesirable.

In order to overcome this problem, one approach of the prior art has been to fabricate the NPN transistor so PNP it has a vertical double-diffused structure while simultaneously fabricating the PNP transistor so that it has a lateral structure. In the lateral structure, the semiconductor layer usually comprises the base, with the emitter and collector regions both located in the base but spaced apart. Both the emitter and collector regions of a lateral PNP transistor can be formed during the same diffusion step used to form the base region of the double-diffused NPN transistor. Thus, there is no need for subsequent high-temperature processing steps after the NPN transistor has been formed. Unfortunately, the distance between junctions in a lateral transistor in on the order of mils rather than microns, and a relatively large charge storage is usually associated with the base. Because of the above shortcomings, a lateral PNP transistor typically cannot operate satisfactorily at frequencies above 1 or 2 MegaHertz, which is an undesirable limitation.

Therefore, another approach is needed in integrated circuit applications for fabricating NPN and PNP transistors in the same monolithic semiconductor substrate. Preferably, both the NPN and PNP transistors should have vertical structures and thus be capable of high-frequency response, such as on the order of 300 to 500 MegaHertz for the NPN transistor and on the order of 50 MegaHertz for the PNP transistor. Also, after the NPN transistor has been fabricated, there should be no further high-temperature processing steps which would detrimentally affect the electrical characteristics of the NPN transistor.

SUMMARY OF THE INVENTION

The structure of the invention overcomes the above-mentioned problems of the prior art because both the NPN transistor and the PNP transistor can be fabricated in the same monolithic semiconductor substrate without compromising the electrical characteristics of the NPN transistor, while providing a PNP transistor with a vertical structure capable of high-frequency response, such as on the order of 50 MegaHertz.

Briefly, the structure comprises a semiconductor layer divided into a plurality of semiconductor areas of one conductivity type electrically isolated from each other. A double-diffused NPN transistor is located in at least one area, and located in at least one other semiconductor area is a PNP transistor with a vertical structure comprising a diffused emitter, an epitaxial base, and a Schottky-barrier collector-base junction with the metal side of the junction acting as the collector. Because the emitter of the PNP transistor can be formed during the step of diffusing the base of the NPN transistor, no additional high-temperature processing steps are needed after completion of the NPN transistor.

DESCRIPTION OF THE PREFERRED EMBODIMENTS

Figure 1:
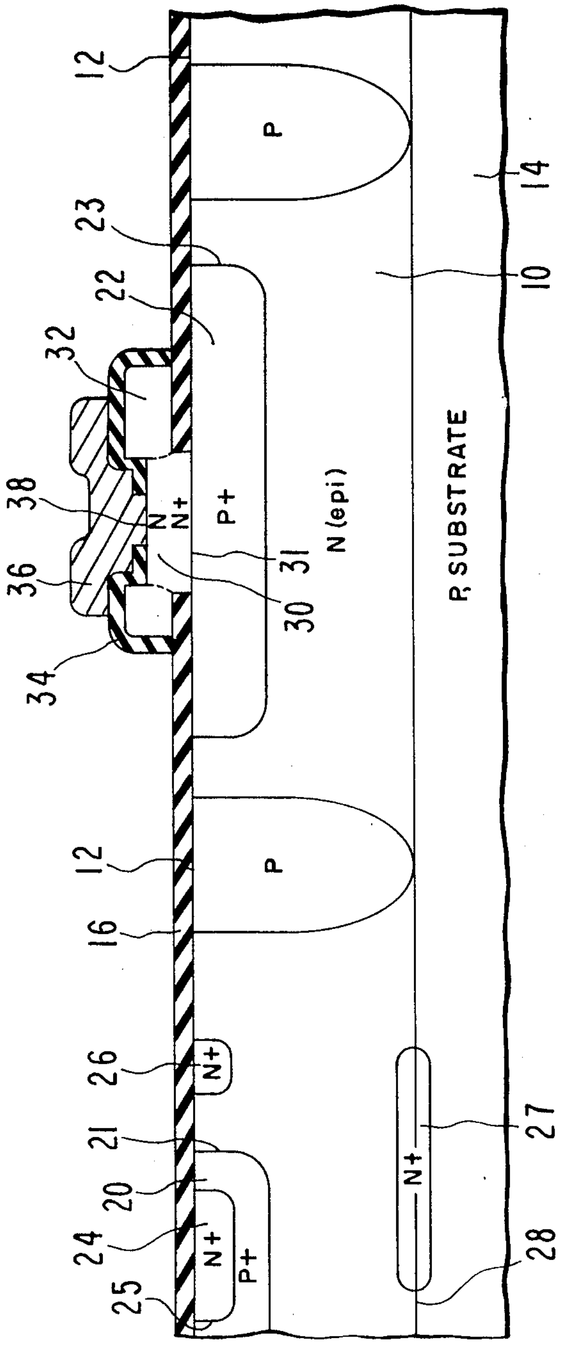
FIG. 1 is a simplified schematic cross-sectional view of a portion of the structure in which a double-diffused NPN transistor is located in one semiconductor area, and a PNP transistor having a diffused emitter, an epitaxial base, and a Schottky-barrier collector-base junction is located in another semiconductor area.

Referring to FIG. 1, the structure of the invention comprises a layer 10 of semiconductor material of one conductivity type, such as N type. Layer 10 has a principal surface 12. Suitably, layer 10 comprises epitaxial semiconductor material grown over and supported by a semiconductor substrate 14 of opposite conductivity type, such as P type.

Preferably, layer 10 comprises a plurality of areas electrically isolated from each other. Electrical isolation between areas can be by any of several techniques commonly used in the semiconductor art, such as dielectric isolation, junction isolation, air isolation, and so forth. In FIG. 1, the structure is shown using junction isolation, wherein PN junctions extend vertically through layer 10 from the upper to the lower surface thereof, and laterally through layer 10 to form the isolated areas.

A layer of protective material 16, such as an oxide, is located over the principal upper surface 12 and functions to protect an edge of the PN junctions appearing at the principal surface 12 from contamination. Portions of oxide layer 16 can be selectively removed to expose active regions and allow ohmic contact to be made thereto.

Located within at least one of the semiconductor areas is a double-diffused NPN transistor, with a portion of semiconductor layer 10 comprising the collector thereof. A region 20 of opposite conductivity type, such as P type, is located within layer 10 and functions as the base. Located between collector layer 10 and base region 20 is the collector-base junction 21, which extends to have an edge at the upper surface 12.

Suitably, region 20 is formed by a high-temperature diffusion step, typically in the range of 1,200° C. Preferably, during the same diffusion step, an emitter region 22 for the PNP transistor is formed in another semiconductor area.

Located in the base region 20 is an emitter region 24 for the NPN transistor, which forms base-emitter PN junction 25 therewith. Junction 25 also extends to have an edge at the principal surface 12.

Suitably, region 24 is formed by a second high-temperature diffusion step. During this second diffusion step, a contact region 26 for the collector 10 can be formed in a portion of the same semiconductor area as the base 20 but spaced apart. Also, it is desirable to have a highly conductive region 27 extending along the lower surface 28 of layer 10 underneath, but separated from, base 20 and contact 26. Region 27 is typically formed in substrate 14 prior to the step of growing layer 10.

After the NPN transistor is completed, it is desirable that the PNP transistor be fabricated without using any additional high-temperature processing steps, in order to avoid detrimentally affecting the electrical characteristics of the NPN transistor. The PNP transistor, however, should have a vertical structure in order to operate at high frequencies, such as on the order of 50 MegaHertz.

Fabrication of the PNP transistor continues by first reoxidizing the principal surface 12, and then removing a portion of oxide layer 16 in order to expose a portion of emitter region 22. Preferably, a second epitaxial layer 30 of semiconductor material is grown over the exposed portion of emitter region 22. During this growth, appropriate impurities are added to layer 30 to make the latter of N-type conductivity. A lateral emitter-base PN junction 31 is located between emitter 22 and base 30. Preferably, the impurity concentration of base layer 30 is graded, wherein the concentration near emitter 22 is approximately $10^{17}$ dopant atoms per cubic centimeter, but decreases as one moves away from emitter 22 until the impurity concentration of base layer 30 farthest away from emitter 22 is approximately $10^{15}$ dopant atoms per cubic centimeter.

A particularly convenient method of forming the second epitaxial layer 30 comprises causing the chemical decomposition of silane by applying heat at around 1,030° C., which is a relatively low temperature compared to temperatures needed for diffusing impurities (around 1,200° C.), and which does not adversely affect the electrical characteristics of the NPN transistor. During the step of growing the second epitaxial layer 30, a polycrystalline silicon layer 32 typically grows over oxide layer 16. Layer 32 also can have impurities located therein. Some or all of layer 32 can be removed as desired or, if additional impurities are added, layer 32 can be used as a low resistance contact to base 30.

A protective layer, such as a second oxide layer 34, is located over the second epitaxial layer 30 and polycrystalline layer 32. Subsequently, a portion of oxide layer 34 is removed to expose a portion of epitaxial layer 30 in the vicinity of the low impurity concentration, that is, where the concentration is on the order of $10^{15}$ dopant atoms per cubic centimeter.

Next, a layer of conductive metal, preferably aluminum, is formed over the exposed portion of the second epitaxial layer 30, that is, where the impurity concentration is on the order of $10^{15}$ dopant atoms per cubic centimeter. A heat treatment step is performed to alloy the aluminum 36 to epitaxial layer 30 and create a Schottky-barrier collector-base junction. The aluminum layer 36 functions as the collector and the second epitaxial layer 30 functions as the base of the PNP transistor. Because this structure is vertical rather than lateral, the distance between the emitter-base and collector-base junctions can be on the order of microns rather than mils. Moreover, there is no large base region compared to lateral transistors and the charge storage is relatively small. In addition, because the PNP transistor is formed so that the epitaxial base 30 and collector-base junction 38 are fabricated at relatively low temperatures compared to high-temperature diffusion steps for the NPN transistor, no compromise need be made in the electrical characteristics of the adjacent NPN transistor. Furthermore, one can add impurities to the polycrystalline layer 32 to provide for an interconnect layer in two-layer interconnection applications.

A semiconductor device has been fabricated incorporating the concept of the invention. The PNP transistor thereof had a vertical structure comprising a diffused emitter, an epitaxial base, and a Schottky-barrier collector-base junction. The latter exhibited a frequency response on the order of 50 MegaHertz, and a gain, or beta, on the order of 3 to 40.

Although means of making external contact to the active regions of the transistors is not shown in the drawing, it is understood that external contact can be made using techniques known in the semiconductor art, such as selectively removing portions of the protective layer 16 to expose a portion of the active regions, and then forming layers of conductive material such as aluminum over the exposed portion of the active regions. Furthermore, external contact to the second epitaxial layer 30 can be made via polycrystalline silicon layer 32 by removing a portion of the second oxide layer 34.

Figure 2:
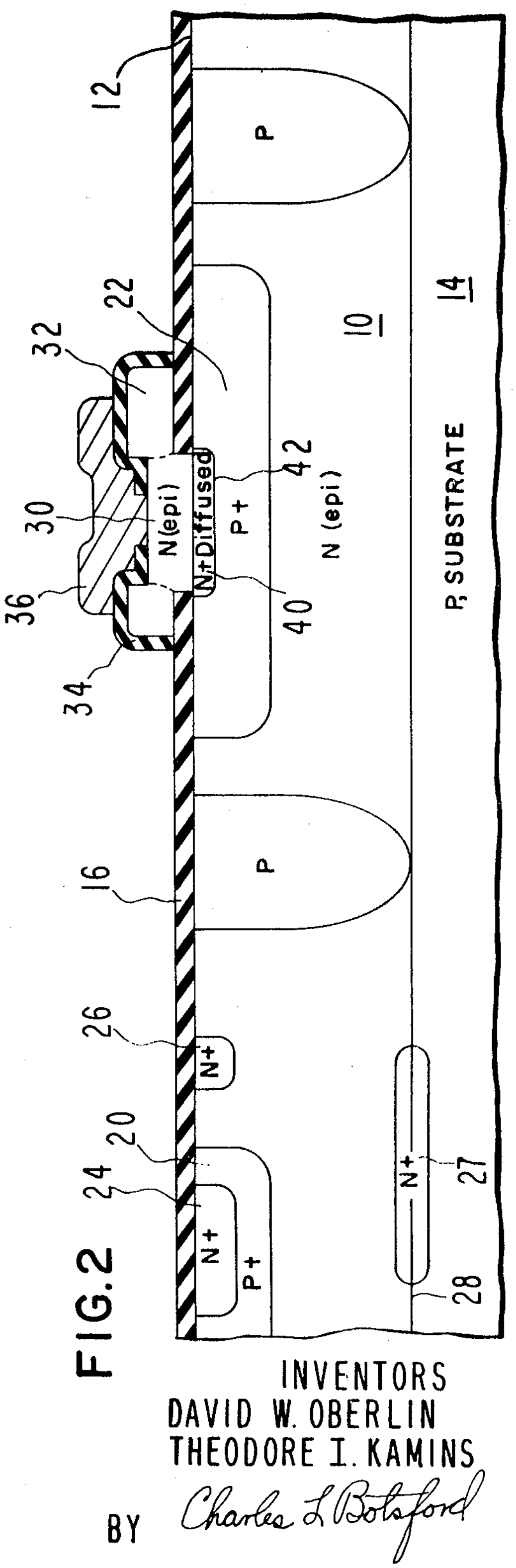
FIG. 2 is a simplified cross-sectional view of an alternative embodiment of the invention in which a portion of the base of the PNP transistor is located in the diffused emitter thereof.

Referring to FIG. 2, an alternative embodiment of the invention is shown. Here, the base of the PNP transistor is not located entirely in the epitaxial layer 30. Instead, prior to the step of growing the epitaxial layer 30, dopant atoms of N-type conductivity are diffused into the emitter 22 to form a portion 40 of the base. Because the remainder of the base is located in the epitaxial layer 30, which is subsequently grown, only a shallow diffusion need be performed for portion 40. Typically, the step is performed at around 800° C. for about 10 minutes, which will not affect the electrical characteristics of the previously formed NPN transistor. The impurity concentration of base portion 40 should be on the order of $10^{17}$ dopant atoms per cubic centimeter. Located between the emitter 22 and base portion 40 is the emitter-base junction 42, which is at a depth of approximately 0.5 micron below the principal surface 12 but extends to have an edge thereat.

The epitaxial layer 30 is next grown over base portion 40, with impurities of N-type conductivity located therein. Instead of having a graded profile, epitaxial layer 30 can have a relatively uniform concentration throughout, such as on the order of $10^{15}$ dopant atoms per cubic centimeter.

While the invention has been described with reference to particular embodiments, it is understood that the invention can be applied to numerous other structures and embodiments by one skilled in the art without departing from the true scope of the invention.

We claim:

1. A semiconductor structure comprising a layer of semiconductor material of one conductivity type and having a principal surface, the layer divided into a plurality of semiconductor areas electrically isolated from each other;

- a layer of protective material overlying selected portions of the principal surface;
- a vertical, double-diffused, NPN transistor located in one of the semiconductor areas,
- a vertical PNP transistor having a first region of opposite conductivity type located in another of the semiconductor areas, the region forming a first PN junction with the layer, the junction extending to have an edge at the principal surface;
- an epitaxial layer of semiconductor material of one conductivity type located along a portion of the principal surface over an exposed portion of the first region, the impurity concentration of the epitaxial layer away from the principal surface being less than $10^{16}$ dopant atoms per cubic centimeter;
- a second protective layer overlying selected portions of the epitaxial layer;
- a layer of conductive metal overlying portions of the second protective layer and extending therethrough to an exposed portion of the epitaxial layer where the impurity concentration is less than $10^{16}$ dopant atoms per cubic centimeter, the metal layer alloyed to the epitaxial layer to form a Schottky-barrier collector-base junction;
- a second PN junction extending along the principal surface formed between the first region and the epitaxial layer, said epitaxial layer having a graded impurity concentration so that at the principal surface the concentration is greater than $10^{16}$ dopant atoms per cubic centimeter.

2. A semiconductor structure comprising a layer of semiconductor material of one conductivity type and having a principal surface, the layer divided into a plurality of semiconductor areas electrically isolated from each other;

- a layer of protective material overlying selected portions of the principal surface;
- a vertical, double-diffused, NPN transistor located in one of the semiconductor areas, a vertical PNP transistor having a first region of opposite conductivity type located in another of the semiconductor areas, the region forming a first PN junction with the layer, the junction extending to have an edge at the principal surface;

an epitaxial layer of semiconductor material of one conductivity type located along a portion of the principal surface over an exposed portion of the first region, the impurity concentration of the epitaxial layer away from the principal surface being less than $10^{16}$ dopant atoms per cubic centimeter;

a second protective layer overlying selected portions of the epitaxial layer;

a layer of conductive metal overlying portions of the second protective layer and extending therethrough to an exposed portion of the epitaxial layer where the impurity concentration is less than $10^{16}$ dopant atoms per cubic centimeter, the metal layer alloyed to the epitaxial layer to form a Schottky-barrier collector-base junction;

a second region of one conductivity type located within the first region and interposed between the first region and the epitaxial layer, the second region forming a second PN junction with the first region that extends to have an edge at the principal surface, the second region having a relatively high impurity concentration, the epitaxial layer having a relatively low impurity concentration.

3. The structure of claim 1 further defined by a layer of polycrystalline semiconductor material of one conductivity type adjacent to and in contact with a portion of the epitaxial layer.

4. The structure in claim 2 further defined by a layer of polycrystalline semiconductor material of one conductivity type adjacent to and in contact with a portion of the epitaxial layer.

5. The structure of claim 1 wherein the semiconductor layer and epitaxial layer are of N-type conductivity, and the first region is of P-type conductivity.

6. The structure of claim 2 wherein the semiconductor layer and epitaxial layer are of N-type conductivity, and the first region is of P-type conductivity.